United States Patent
Hseih et al.

(10) Patent No.: US 8,138,795 B2
(45) Date of Patent: Mar. 20, 2012

(54) SELF-AWARE ADAPTIVE POWER CONTROL SYSTEM AND A METHOD FOR DETERMINING THE CIRCUIT STATE

(75) Inventors: Wei-Chih Hseih, Taoyuan County (TW); Wei Hwang, Salarnanca La Verna, CA (US)

(73) Assignee: National Chiao Tung University, Hsinchu (TW)

( * ) Notice: Subject to any disclaimer, the term of this patent is extended or adjusted under 35 U.S.C. 154(b) by 1107 days.

(21) Appl. No.: 11/971,480

(22) Filed: Jan. 9, 2008

(65) Prior Publication Data
US 2009/0158073 A1 Jun. 18, 2009

(30) Foreign Application Priority Data
Dec. 12, 2007 (TW) ................................ 96147398 A

(51) Int. Cl.
*H03K 19/00* (2006.01)
(52) U.S. Cl. .............................. 326/93; 326/80; 713/340
(58) Field of Classification Search .................... 326/33, 326/83, 93, 35; 713/340, 320
See application file for complete search history.

(56) References Cited

U.S. PATENT DOCUMENTS

| | | | | |
|---|---|---|---|---|
| 6,466,077 | B1 * | 10/2002 | Miyazaki et al. ............. | 327/534 |
| 6,985,025 | B1 | 1/2006 | Maksimovic et al. | |
| 7,149,903 | B1 | 12/2006 | Chan et al. | |
| 7,164,291 | B2 * | 1/2007 | Mair et al. ....................... | 326/83 |
| 7,190,187 | B2 * | 3/2007 | Hua et al. ........................ | 326/27 |
| 7,276,932 | B2 | 10/2007 | Kuang et al. | |
| 7,589,584 | B1 * | 9/2009 | Bui ................................ | 327/538 |
| 2003/0184364 | A1 * | 10/2003 | Miyagi ........................ | 327/544 |

OTHER PUBLICATIONS

M. Nakai et al., "Dynamic Voltage and Frequency Management for a Low-Power Embedded Microprocessor", *IEEE Journal of Solid-State Circuits*, vol. 40, No. 1, pp. 28-35, Jan. 2005.

* cited by examiner

*Primary Examiner* — Shawki S Ismail
*Assistant Examiner* — Crystal L Hammond
(74) *Attorney, Agent, or Firm* — Bui Garcia-Zamor; Hung H. Bui, Esq.

(57) ABSTRACT

The present invention provides a self-aware power control system and a method for determining the circuit state. The self-aware adaptive power control architecture comprises of a multi-mode power gating network, a current monitoring translator, a variable threshold comparator, a slack detector, and a bi-directional shift register. The multi-mode power gating network controls the amount of supply current and hence the circuit speed. The power gating network can be composed of either N-type MOSFETs for virtual ground insertion or P-type MOSFETs for virtual supply insertion. The number of MOSFETs in the multi-mode power gating network can be configured according to the supply range and step difference of the supply current. Then, by monitoring the current characteristics drained by target circuit, the circuit state can be determined. No delay matching circuit is required. Together with other peripherals, the supply current can be down controlled to a minimum acceptable level. The circuit will use up all available slack. The smaller current implies lower power consumption as well. Furthermore, the present invention is capable of self adaptation to frequency change. To summarize, the present invention can make the circuit consume least power under various frequency achieving best power efficiency.

20 Claims, 3 Drawing Sheets

SELF-AWARE ADAPTIVE POWER CONTROL SYSTEM AND A METHOD FOR DETERMINING THE CIRCUIT STATE

CROSS-REFERENCE TO RELATED APPLICATIONS

This application claims all benefits accruing under 35 U.S.C. §119 from Taiwanese Patent Application No. 096147398, filed on Dec. 12, 2007 in the Intellectual Property Office Ministry of Economic Affairs, Republic of China, the disclosure of which is incorporated herein by reference.

TECHNICAL FIELD

The present invention relates to a self-aware adaptive power control system, and particularly to a self-aware adaptive power control system suitable for all kinds of digital circuit for achieving least power consumption acceptable for circuit operation.

BACKGROUND OF THE INVENTION

Recently, due to the tremendous development of semiconductor processing technologies, the fast growth of transistor density and system complexity makes the conventional ASIC (Application specific integrated circuit) design advance to SoC (System-on-a-Chip) design. Although the SOC technology can improve the performance, on the other hand, it introduces serious power consumption issues. Therefore, controlling and further reducing power consumption becomes an important design consideration for advanced technologies.

Nowadays, there have been some patent disclosures and non-patent disclosures developed to solve the problem with different methods. Hereinafter, the techniques and defects for those patent disclosures and non-patent disclosures will be described.

[1] The U.S. Pat. No. 7,276,932 published on Oct. 2, 2007 discloses an architecture using virtual power gating cells (VPC), in which the virtual power gating cells are composed of a control circuit for buffering the control signal and two or more NFETs and PFETs power gating blocks (PGB). However, the power gating cells can only be used as a pure switch, that is, only providing the ON (connected) and OFF (disconnected) states for the carried circuit and power supply. Except for saving the static power under closed state, there is no capability of dynamic power control. Moreover, the continuous transmission of control signal is only used for reducing the sudden peak power when turning on VPCs, which is different from the method of multi-mode power gating network (with detailed description hereinafter) proposed in the present invention. Also, the present invention can control the amount of supply current to achieve the purpose of controlling circuit operation speed, which can not be achieved by the prior art.

[2] The prior art as the U.S. Pat. No. 6,985,025 published on Jan. 10, 2006 and The U.S. Pat. No. 7,149,903 published on Dec. 12, 2006 proposes an adaptive voltage regulation method, which employs a delay matching circuit requiring additional reference clock to determine the circuit characteristics, and the power overhead thereof is larger. And, the delay matching circuit has to add with voltage safety margins to prevent the functional error caused by variation of processing and operational environment. Therefore, the two conventional techniques will have limited effect on reducing power consumption. The adaptive power control (with detailed description hereinafter) according to the present invention can not only improve the above-mentioned defects, but also keep the capability of reaction to the variance, and provide the optimized effect on reduction of power consumption under the required circuit operational speed.

[3] A technique for using dynamic voltage switching (DVS) and frequency adjustment proposed by M. Nakai et al can be used as a method for effectively reducing power consumption (M. Nakai, S. Akui, K. Seno, T. Meguro, T. Seki, T. Kondo, A. Hashiguchi, H. Kawahara, K. Kumano, and M. Shimura, "Dynamic Voltage and Frequency Management for a Low-Power Embedded Microprocessor, "*IEEE Journal of Solid-State Circuits*", Vol. 40, No. 1, pp. 28-35, January 2005). The prior art employs a delay synthesizer combining the gate delay, the interconnection delay induced by resistors and capacitors effects of wires, and the rise/fall delay to achieve the better emulation of critical path. However, the prior art also employs a delay matching circuit theoretically, and has the above-mentioned identical defects. Moreover, owing to the substantial large power overhead, it could only conduct the overall modulation on the level of entire chip, and could not have the optimization on respective details inside the chip. On the contrary, the architecture proposed by the present invention (with detailed description hereinafter) has a very small power overhead, so that it can apply the power control for each block having residual slack in the chip. As a whole, the operational speed will not be influenced, and the result of adaptive power control can reduce the power consumption to the minimum.

Furthermore, when the prior art [2] and [3] is implementing the adaptive or dynamic voltage modulation, it is required of a worst case critical path delay matching circuit, but actually the worst case is seldom occurred. Moreover, for corresponding to various variances, the voltage safety margins should be considered, so that it will greatly under-estimate the possibility of power reduction. Besides, the employed control circuit needs additional reference clock and a plurality of flip-flops, so that there is a certain level of area and power overhead, and it could not be applied on the modulation of details. And, because the time period of reaction variation is always at µs level, they are not suitable for real-time modulation for current high speed circuits.

In order to improve the defects in the prior art, the present invention proposes an innovative adaptive power control system and a method for determining the circuit state, which is suitable for all kinds of digital circuits, and only consumes the minimum power under various frequencies to achieve the best power efficiency.

The object of the present invention is to provide an adaptive power control system, which employs the current monitoring method to determine the circuit state. The method requires no delay matching circuit, and makes the corresponding compensation to the variations on the overall operational environment, including process, temperature and supply voltage variations.

The other object of the present invention is to provide a multi-mode power gating network. This architecture can control the amount of supply current, and change the circuit operational speed, and further control the power consumption in the circuit.

The further another object of the present invention is to provide a method for determining the circuit state, which can monitor the characteristics of current consumption, determining if the circuit is currently at operational or stable state, and controlling the supply current to a minimum acceptable level, so that the circuit operating time can be as long as possible to the clock cycle time, and to reduce the excess power consumption.

The other object of the present invention is to provide an adaptive power control system, which provides a self-aware capability on the change of working frequency. When the frequency is changed, the system itself can suitably modify the supply current to make the circuit operational speed meeting the requirement of new frequency.

The further another object of the present invention is to provide a self-aware adaptive power control system. The adaptive power control system can be repetitively used without limits in any integrated circuit, and the adaptive power control systems associated with each accommodated circuit can independently operate without interaction with each other.

SUMMARY OF INVENTION

The present invention proposes a self-aware adaptive power control system, which is composed of a multi-mode power gating network (MPGN) configured between the logic circuit and the power supply for controlling the supply current and defining the upper limit of supply current to control the circuit speed and the circuit power; a current monitoring translator for identifying the current drained by the power supply and monitoring the current variation; a variable threshold comparator for determining if the accommodated circuit is at operational or stable state, and the variable threshold comparator can change the determination threshold thereof based on the maximum current value outputted from the current monitoring translator, and compare the relative change with the momentary current value of the current monitoring translator to determine the state of the accommodated circuit; a slack detector for comparing the determination result from the variable threshold comparator with the clock period to determine if the operation of the accommodated circuit has used up the time mostly approaching the length of clock period; and, a bi-directional shift register for receiving the comparison result from the slack detector and outputting the control of the multi-mode power gating network.

Moreover, the multi-mode power gating network comprises: a power portion, which is connected with the power supply; a plurality of power gates, which are composed of a series of parallel connected transistors, and if the transistors used for the power gates are P-type channel field effect transistors (FETs), the power portion will be connected with the high potential of the power supply, and if the transistors used for the power gates are N-type channel FETs, the power portion will be connected with the low potential or ground potential of the power supply; a current control portion, which is connected with the accommodated circuit; and, a control signal portion, which is configured on each of the power gates.

Furthermore, the current monitoring translator comprises: a reference circuit, which is configured between the logic circuit and the power supply and outputs a first voltage ($V_r$) to the level shift circuit; a level shift circuit, which shifts the first voltage ($V_r$) to a second voltage ($V_{cm}$) to be inputted to the current mirror circuit so as to eliminate the dead band of the P-type current mirror; and, a current mirror circuit, which is composed of a plurality of mirror transistors with different sized, and the number and parameter configuration for these mirror transistors are corresponding to the architecture of the multi-mode power gating network.

The present invention further provides a method for monitoring the current variation to determine the circuit state, which includes the following steps: having the current monitoring translator to monitor current variation; outputting momentary current values at least including the transient variation and the maximum current value in each frequency period, and converting the current values into a corresponding voltage value; and, determining whether the circuit is at operation or stable state according to the maximum current value changing the determination threshold of the variable threshold comparator itself and by comparing with the momentary current value for the relative variance.

The self-aware adaptive power control system and the method for determining the circuit state according to the present invention can be applied for all kinds of digital circuits, and control the amount of supply current to effectively reduce to the lowest level, but maintain the normal operation of the circuit; furthermore, the present invention can also control the power of the accommodated circuit, so that it can only consume the least power under various frequencies and achieve the best energy efficiency.

The above-mentioned and other objects, features and advantages of the present invention can be further appreciated by the following embodiments and associated figures as the detailed description.

DETAILED DESCRIPTION OF PREFERRED EMBODIMENTS

Figure 1:
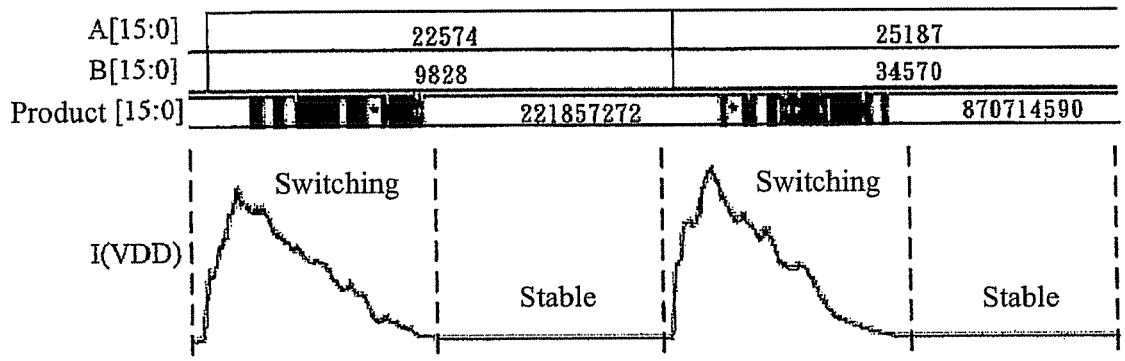
FIG. 1 is a characteristic curve diagram for the current drained from the ideal power supply during circuit switching.

Referring to FIG. 1, it is a characteristic curve diagram for the current drained from the ideal power supply with a 16-bit multiplier during circuit switching. As observed from the curve in FIG. 1, the multiplier will drain a large amount of current during the switching period, so as to exhibit a sharp momentary current peak. When the multiplication result has been successfully computed, the multiplier, except for the current leakage, will enter a stable state without draining any charge current or discharge current. In other words, in order to have success computing, the steady state period of the circuit should be identified to ensure it will be longer than a specific time. Thus, a current monitoring method has been developed to identify the current amount drained from the power and to determine the circuit state during switching between the switching state and the stable state.

Figure 2:
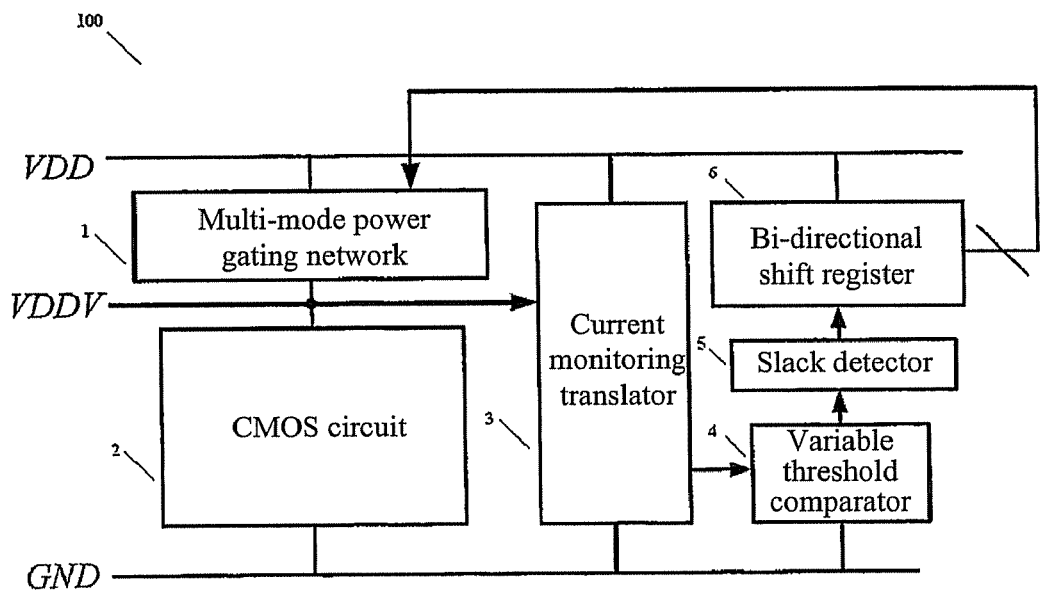
FIG. 2 is a block diagram of an adaptive power control system with current monitoring according to the present invention.

Referring to FIG. 2, it is a block diagram of a self-aware adaptive power control system according to the present invention. The adaptive power control system 100 comprises: a multi-mode power gating network (MPGN) 1, which is configured between the logic circuit and the power supply for controlling the supply current and defining the upper limit of the supply current to control the circuit speed and the circuit power; a current monitoring translator 3, which is used to identify the amount of current drained from the power supply and monitor the current variation; a variable threshold comparator 4, which receives the information from the current monitoring translator 3, and provides a variable threshold based on the dynamic determination of a relative high current and a relative low current, so as to determine if the accommodated circuit is now at the operational or stable state; a slack detector 5, which is used to compare the determination result from the variable threshold comparator 4 with the clock period, and determine if the operation of the accommodated circuit has used up the time mostly approaching the length of the clock period; and, a bi-directional shift register 6, which contains the control words for the multi-mode power gating network 1 and controls the multi-mode power gating network 1, and employs the result from the variable threshold comparator 4 and the slack detector 5 to indicate the shift direction of the bi-directional shift register 6.

The loop of the adaptive power control system 100 is started by configuring the power supply of the CMOS circuit 2 in the multi-mode power gating network 1; and, the current monitoring translator 3 will receive and process the message of the drain current in the CMOS circuit 2; and, sequentially transmitting the result to the variable threshold comparator 4, the slack detector 5 and the bi-directional shift register 6; and, in the final the loop will adjust strength of the multi-mode power gating network 1, so that the operational period of the loop could be the same as the clock period of the CMOS circuit 2. The following will describe in details about the detailed circuit operation of the self-aware adaptive power control system 100.

Figure 3:
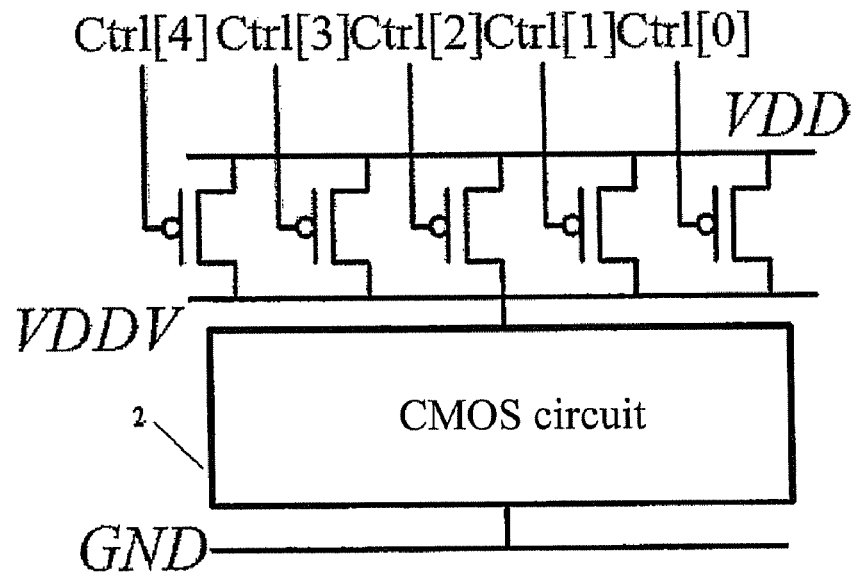
FIG. 3 is a circuit diagram of a multi-mode power gating network according to the present invention.

In fact, the multi-mode power gating network (MPGN) 1 configured between the logic circuit and the power supply is a parallel connected power switch network, as shown in FIG. 3. Conventionally, the power gating devices are used to cut off the circuit blocks at standby state, and also minimize the effect to the circuit delay. However, the power gating devices proposed in the present invention is to define the upper limit of the supply current and reduce the power consumption.

Assuming the switch capacitance of the target circuit is a constant, when charging the switch capacitance to the voltage level, the charge amount is represented as equation (1):

$$Q = CV = I\Delta t \quad (1)$$

Wherein, Q is the required charge amount, C is the switch capacitance, and V is the target voltage level. Within a very short period, the charge will be provided by the supply current, in which I indicates the average current, and $\Delta t$ is the time required by charging to the capacitance. It could also be the following condition: under the condition of a certain average current I, the corresponding time $\Delta t$ is the delay of the target circuit, so that the required current could be easily estimated by defining the delay increment in equation (1).

The size of the multi-mode power gating network 1 can be configured based on the amount of the supply current. As shown in Table 1, it shows a sample architecture of the power switching network when using five power switches (as shown in FIG. 3), wherein each column indicates the different number of switches at ON state and configured with different upper limit for the supply current. The control words, Ctrl[0]~Ctrl[4], are used to control the ON/OFF state for each power switch. During adjustment of the multi-mode power gating network 1, the power switches at ON state and with larger index marks will be closed in high priority; on the other hand, the power switches at OFF state and with smaller index marks will be opened in high priority. When the last switch, controlled by Ctrl[0], is closed, the circuit will be at the power cut-off state.

TABLE 1

Sample architecture of Multi-mode power gating network 1

|  | Number of ON switches | | | | |
|---|---|---|---|---|---|
|  | 5 | 4 | 3 | 2 | 1 |
| VDDV | 1.0 V | 0.9 V | 0.8 V | 0.7 V | 0.5 V |
| $\Delta t$ increment(%) | 0% | 20% | 40% | 60% | 80% |
| I(% of $I_{max}$) | 100% | 75% | 58% | 44% | 33% |

The maximum average current ($I_{max}$) could be estimated from the average power consumption of the unmodified target circuit. The configured standard supply voltage (VDD) is 1.1V. When the multi-mode power gating network 1 is fully opened (as the configuration of the first column in Table 1 that all five switches are opened), the minimum acceptable voltage (VDDV) can be set as 1V. Assuming the delay increment $\Delta t$ is ideally 0% (no delay overhead), the multi-mode power gating network 1 can provide the full maximum average current. Referring to Table 1, as the configuration in the second column, there are only four power switches connected and allowed with delay increments as 20% and with the minimum acceptable voltage configured as 0.9V, which is the target voltage level required for charge switching capacitance), so that the required current can be next estimated with equation (1) to be 75% of the maximum average current. The configuration of other switches with less opened state can be acquired in sequence as the above-mentioned method. After acquiring the information of the required current for each configuration, the transistor width of each power switch can be determined using a first-order, triode-region transistor current-voltage formula.

During the stable state as shown in FIG. 1, only the current leakage is existed. On the contrary, during the circuit switching, the logic circuit needs to drain a large amount of current from the power supply. Herein, the current characteristic indicates whether the circuit is at switching state or stable state. In the adaptive power control system 100 according to the present invention, the supply current is controlled by the multi-mode power gating network 1. All of the power switches are operating in the linear region. The current supplied by the power switch is proportional to the drain/source voltage, and the drain/source voltage is related to the VDDV in FIG. 3. On other words, VDDV is changed according to the current characteristic.

Figure 4:
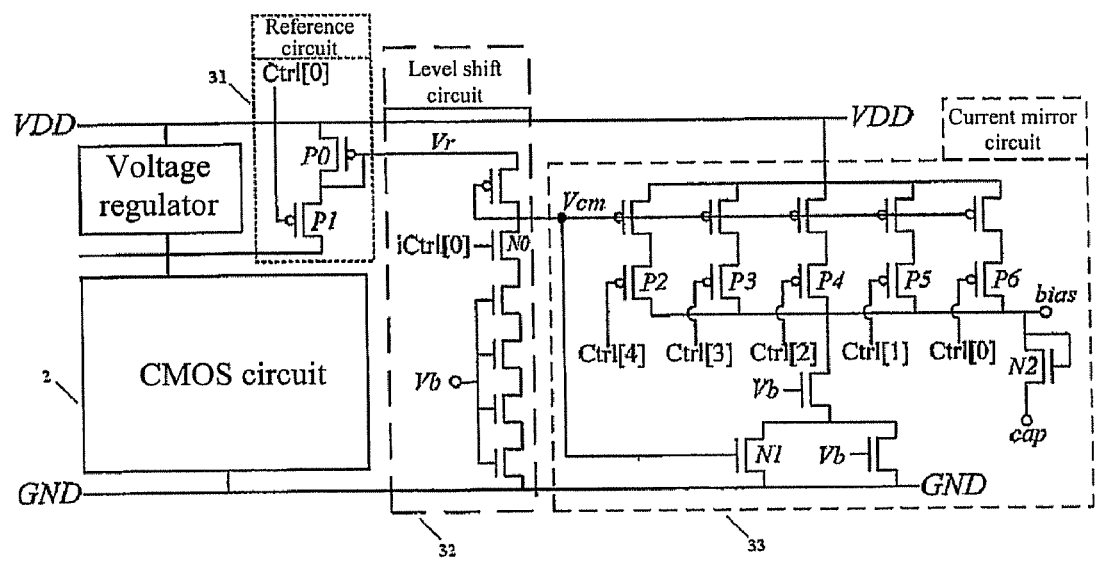
FIG. 4 is a circuit structural diagram of a low power current monitoring translator according to the present invention.

The low power current monitoring translator 3 according to the present invention has a good monitor performance. As shown in FIG. 4, it is a circuit structural diagram of the low power current monitoring translator according to the present invention. The structure of the low power current monitoring translator 3 comprises a reference circuit 31, a level shift circuit 32, and a current mirror circuit 33, which are described in details as follows.

The reference circuit 31 of the current monitoring translator 3 is configured between VDD and VDDV, and generates a voltage $V_r$ to the level shift circuit 32. The level shift circuit 32 is used to convert the $V_r$ into $V_{cm}$ for eliminating the dead band of the P-type current mirror, and $V_b$ is the bias of the level shift circuit.

The current mirror circuit 33 is composed of five mirror transistors in different sizes, wherein the five mirror transistors are corresponding to the five different structures of the multi-mode power gating network 1 in Table 1. The transistor N1 is controlled by $V_{cm}$. When the other two NMOS transistors are controlled by $V_b$, and provide the basic loading, the transistor N1 is used to provide different loading capabilities.

The voltage level of bias node will be changed in the opposite direction to $V_{cm}$. The NMOS loading with variable strength will make the $V_{bias}$ have the same variation range as VDDV.

In each different circuit operation, it is assumed that the current drained by the circuit is non-correlated and unpredictable. Thus, what important shall be the relative amount, but not the absolute amount in each operational period. Transistor N2 is a diode-connected NMOS transistor, which is used to capture the maximum value of $V_{bias}$ voltage in each period, and store in the cap node. The $V_{bias}$ and $V_{cap}$ will be applied to the variable threshold comparator 4.

When the accommodated circuit is at the power cut-off state, the transistors P1 to P6 and N0 are used to close the current monitoring translator 3. The reference current can be used for circuit switching through P0 and P1, but not wasted, and used for reducing the power overhead. The compensation of switching current can prevent the current monitoring translator 3 from harmful effect to the circuit speed. The level shift circuit 32 employs the long channel transistor to eliminate the static current, and the current mirror circuit 33 can use the possibly smaller size but still exist fast response in response to the current variation in the circuit.

As previously described, the current characteristic has no regular model, and is non-related. However, it could be known that, in the actual supply system, if $V_{bias}$ is reduced below a certain level relative to the peak with the same operational period, it could be determined as success computation. Therefore, the present invention can use one variable threshold comparator 4 to identify the relative high value and the relative low value of $V_{bias}$.

Figure 5:
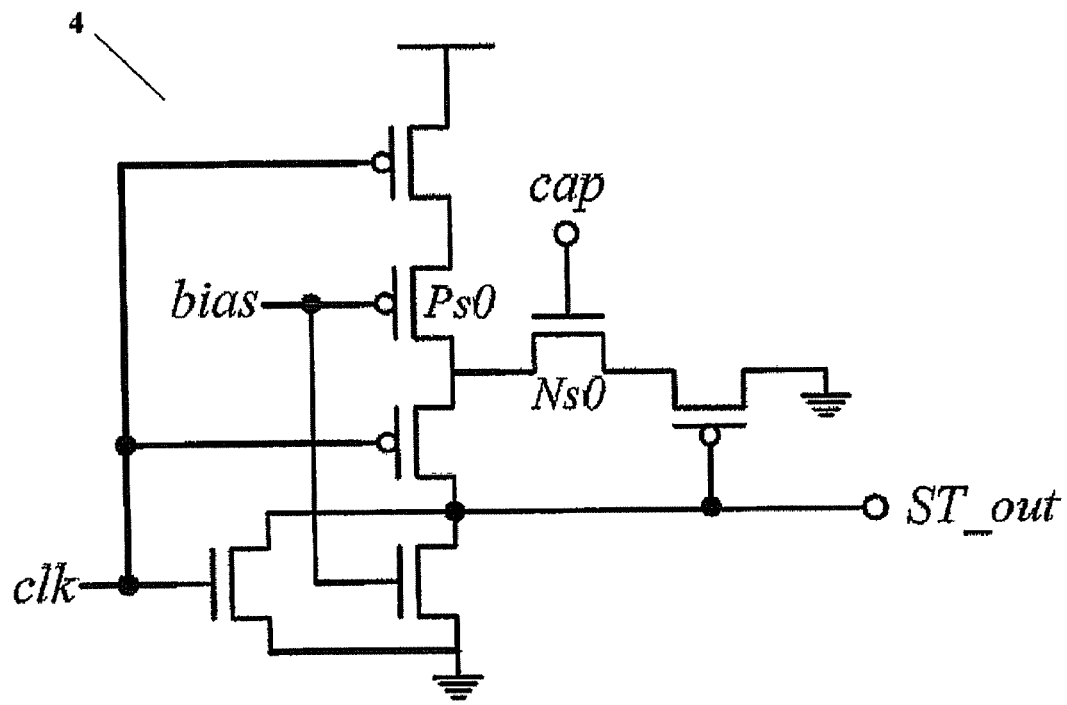
FIG. 5 is a circuit diagram of a variable threshold comparator according to the present invention.

As shown in FIG. 5, it is a circuit diagram of a variable threshold comparator 4 according to the present invention. The node cap will capture the peak of node bias in each period. When the control loop ended, the node cap will be discharged to prepare for capturing the peak of the node bias in the next period. Different $V_{cap}$ will make the variable threshold comparator 4 generate different determination thresholds. When $V_{bias}$ is reduced below the relative value of $V_{cap}$, the variable threshold comparator 4 will be operated and it is determined as success computation. Actually, $V_{cap}$ is lower than $V_{bias}$ peak with a threshold voltage of the N channel transistor, but this could be compensated by adjusting the strength of transistors Ps0 and Ns0 by sizing.

The slack detector 5 in FIG. 2 can monitor the determination by the variable threshold comparator 4 and compare with the operational frequency. If the determination time of the variable threshold comparator 4 is far earlier than the next clock rising edge, it means that the slack is not used up, and the power supply will be weakened. On the contrary, if the variable threshold comparator 4 is not determined until reaching the expiry time, the slack detector 5 will inform the system to enhance the power supply. The determined expiry time is determined by the operational frequency of the circuit. Therefore, the adaptive power control system 100 according to the present invention can provide the self-aware ability of frequency modulation due to the detection mechanism of the slack detector 5.

Figure 6:
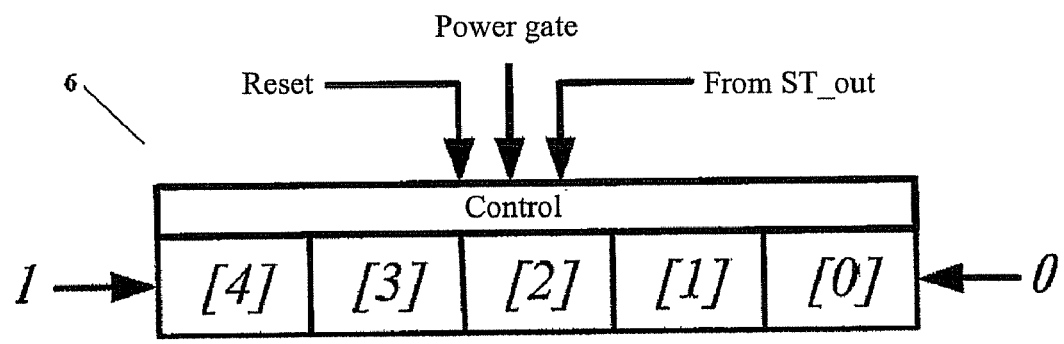
FIG. 6 is a diagram of a bi-directional shift register according to the present invention.

As shown in FIG. 6, it is a diagram of a bi-directional shift register 6 containing control words for the multi-mode power gating network 1 according to the present invention. If the slack detector 5 determined the success computation in time and there is still unused slack, the strength of the multi-mode power gating network 1 can be further weakened. "1" will be shifted from the leftest into the bi-directional shift register 6 to close the maximum index mark switch, which is still at ON state. If the success computation has not been determined or there is no sufficient slack left, "0" will be shifted from the most right into the bi-directional shift register 6 to open the minimum index mark switch which is currently at OFF state. When all the slacks have been used, the bi-directional shift register 6 can still maintain the same stable state for the power supply. The reset and power cut-off control can make the multi-mode power gating network 1 supply the maximum power or conduct the power cut-off configuration. Therefore, the present invention can determine if the success computation is completed by itself, and configure the power control of the target circuit to the lowest acceptable level.

Although the present invention has been disclosed with the preferred embodiments, they should not be construed as limiting the present invention. The skilled in the art can make certain changes and modification without departing from the spirit and scope of the present invention. The protection scope of the present invention should be defined with the attached claims.

| EXPLANATION OF MAIN COMPONENTS | |
| --- | --- |
| 1 | Multi-mode power gating network |
| 2 | CMOS circuit |
| 3 | Current monitoring translator |
| 4 | Variable threshold comparator |
| 5 | Slack detector |
| 6 | Bi-directional shift register |
| 31 | Reference circuit |
| 32 | Level shift circuit |
| 33 | Current mirror circuit |
| 100 | Self-aware adaptive power control system |

We claim:

1. A self-aware adaptive power control system for making corresponding compensation on the variation of overall operation environment for the circuit, which comprises:
   a multi-mode power gating network (MPGN), which is configured between a logic circuit and a power supply, for controlling a supply current and defining an upper limit of the supply current to control the circuit speed and the circuit power;
   a current monitoring translator, which is used to identify an amount of current drained from the power supply and monitor a current variance;
   a variable threshold comparator, which receives information from the current monitoring translator and provides a variable threshold, and which determines if the accommodated circuit is at an operation state or a stable state;
   a slack detector, which is used to compare the determination result from the variable threshold comparator with a clock period to determine if the operation of the accommodated circuit has used up the time mostly approaching a length of the clock period; and
   a bi-directional shift register, which contains control words for the multi-mode power gating network and controls the multi-mode power gating network, and which employs the result from the variable threshold comparator and the slack detector to indicate a shift direction of the bi-directional shift register.

2. An adaptive power control system according to claim 1, wherein the multi-mode power gating network comprises:
   a power portion, which is connected with the power supply;
   a plurality of power gates, which are composed of a series of transistors connected in parallel;
   a current control portion, which is connected with the accommodated circuit; and
   a control signal portion, which is configured on each of the power gates.

3. An adaptive power control system according to claim 2, wherein, when the transistors used for the power gates are P-type channel field effect transistors, the power portion is connected with a high potential of the power supply.

4. An adaptive power control system according to claim 2, wherein, when the transistors used for the power gates are N-type channel field effect transistors, the power portion is connected with a low potential or a ground potential of the power supply.

5. An adaptive power control system according to claim 2, wherein the supply current capabilities of the power gates are adjusted according to the amount of the supply current.

6. An adaptive power control system according to claim 2, wherein a number of power gates is adjusted depending on a step difference and a variation range of the supply current.

7. An adaptive power control system according to claim 1, wherein the current monitoring translator comprises:
a reference circuit, which is configured between the logic circuit and the power supply, and which outputs a first voltage;
a level shift circuit, which shifts the first voltage as a second voltage so as to eliminate a dead band of the P-type current mirror; and
a current mirror circuit, which is composed of a plurality of mirror transistors with different sizes, and which is controlled by the second voltage to monitor the current variance,
wherein a number of mirror transistors is corresponding to the architecture of the multi-mode power gating network.

8. An adaptive power control system according to claim 7, wherein the level shift circuit employs transistors with a long channel to suppress a static current.

9. An adaptive power control system according to claim 1, wherein the corresponding compensation is made to the variation of process, temperature, supply voltage or switching current.

10. An adaptive power control system according to claim 1, wherein, when the current monitoring translator monitors the current variance, two parameters are output to the variable threshold comparator, where one of the parameters is a momentary current value changing along with the time, and the other one of the parameters is a maximum current in each clock period, and both the parameters can be converted into corresponding voltage values.

11. An adaptive power control system according to claim 1, wherein the variable threshold comparator changes a determination threshold thereof according to a maximum current value outputted from the current monitoring translator, and compare with a momentary current value of the current monitoring translator for the relative variance so as to determine the state of the accommodated circuit.

12. An adaptive power control system according to claim 1, wherein the slack detector monitors the determination result from the variable threshold comparator and compares with the clock period, and if the determination time of the variable threshold comparator is far earlier than a clock rising edge, the slack detector informs the adaptive power control system to weaken the supply power, and, if the determination time of the variable threshold comparator is not determined until reaching the expiry time, the slack detector informs the adaptive power control system so as to enhance the supply power, provide the self-aware ability of frequency modulation, in which the expiry time is determined by the operational frequency of the circuit.

13. An adaptive power control system according to claim 1, wherein the bi-directional shift register is a set of registers connected in series, which is stored with a series of "0" and "1" signals, and is used for bi-directional shifting on stored signals to be configured as the control words for the plurality of power gates in the multi-mode power gating network.

14. An adaptive power control system according to claim 13, wherein the number of registers for the bi-directional shift registers is the same as the number of the plurality of power gates in the multi-mode power gating network.

15. An adaptive power control system according to claim 13, wherein the bi-directional shift register responds to global power cut-off control signals to cut off the connection between the accommodated circuit and the power supply.

16. An adaptive power control system according to claim 1, wherein the variable threshold comparator is a Schmitt Trigger.

17. An adaptive power control system according to claim 1, wherein the adaptive power control system can be repetitively used without limit in any integrated circuit, and the adaptive power control system associated with each accommodated circuit can independently operate without interaction with each other.

18. An adaptive power control system to control power consumption of a digital circuit, comprising:
a multi-mode power gating network disposed between a digital circuit and a power supply, to define an upper limit of a supply current so as to control power and speed of the digital circuit;
a current monitoring translator arranged to identify an amount of current drained from the power supply and to monitor a current variance;
a variable threshold comparator arranged to receive information from the current monitoring translator and provide a variable threshold based on a dynamic determination of a relative high current and a relative low current so as to determine if the digital circuit is at an operation state or a stable state;
a slack detector arranged to compare a result from the variable threshold comparator with an operational frequency; and
a bi-directional shift register arranged to employ the result from the variable threshold comparator and the slack detector to indicate a shift direction so as to control the power supply to the digital circuit, via the multi-mode power gating network.

19. An adaptive power control system according to claim 18, wherein the multi-mode power gating network comprises a series of transistors connected in parallel between the power supply and the digital circuit, and wherein a number of transistors is adjusted depending on a step difference and a variation range of the supply current.

20. An adaptive power control system according to claim 18, wherein the current monitoring translator comprises:
a reference circuit disposed between the digital circuit and the power supply, to generate a first voltage;
a level shift circuit arranged to shift the first voltage as a second voltage; and
a current mirror circuit comprised of a plurality of mirror transistors and controlled by the second voltage to monitor the current variance,
wherein a number of mirror transistors is corresponding to an architecture of the multi-mode power gating network.

* * * * *